(12) United States Patent
Vincent et al.

(10) Patent No.: US 11,817,366 B2
(45) Date of Patent: Nov. 14, 2023

(54) SEMICONDUCTOR DEVICE PACKAGE HAVING THERMAL DISSIPATION FEATURE AND METHOD THEREFOR

(71) Applicant: NXP USA, INC., Austin, TX (US)

(72) Inventors: Michael B. Vincent, Chandler, AZ (US); Scott M. Hayes, Chandler, AZ (US); Zhiwei Gong, Chandler, AZ (US); Kabir Mirpuri, Scottsdale, AZ (US); Rushik P. Tank, Chandler, AZ (US); Betty Hill-Shan Yeung, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/113,345

(22) Filed: Dec. 7, 2020

(65) Prior Publication Data

US 2022/0181230 A1  Jun. 9, 2022

(51) Int. Cl.
*H01L 23/367* (2006.01)
*H01L 23/66* (2006.01)
(Continued)

(52) U.S. Cl.
CPC ........ *H01L 23/367* (2013.01); *H01L 21/4853* (2013.01); *H01L 21/4882* (2013.01);
(Continued)

(58) Field of Classification Search
CPC .............. H01L 23/367; H01L 21/4853; H01L 21/4882; H01L 23/49811; H01L 23/66; H01L 2223/6677; H01L 24/73; H01L 23/552; H01L 23/3672; H01L 24/16; H01L 24/32; H01L 24/92; H01L 2224/16227; H01L 2224/32225; H01L 2224/73204; H01L 23/49827; H01L 2224/32245; H01L 2224/73253; H01L 2224/92125;
(Continued)

(56) References Cited

U.S. PATENT DOCUMENTS 6,255,143 B1  7/2001  Briar
7,355,289 B2  4/2008  Hess et al.
(Continued)

FOREIGN PATENT DOCUMENTS

EP    3690935 A1    8/2020
WO  2017222471 A1  12/2017

OTHER PUBLICATIONS

U.S. Appl. No. 17/241,156, filed Apr. 27, 2021, entitled "Semiconductor Device Package Having Thermal Dissipation Feature and Method Therefor".
(Continued)

*Primary Examiner* — Patricia D Valenzuela

(57) ABSTRACT

A semiconductor device package having a thermal dissipation feature is provided. The semiconductor device package includes a package substrate. A semiconductor die is mounted on a first surface of the package substrate. A first conductive connector is affixed to a first connector pad of the package substrate. A conformal thermal conductive layer is applied on the semiconductor die and a portion of the first surface of the package substrate. The conformal thermal conductive layer is configured and arranged as a thermal conduction path between the semiconductor die and the first conductive connector.

20 Claims, 12 Drawing Sheets

(51) Int. Cl.
*H01L 21/48* (2006.01)
*H01L 23/498* (2006.01)
*H01L 23/00* (2006.01)

(52) U.S. Cl.
CPC ........ *H01L 23/49811* (2013.01); *H01L 23/66* (2013.01); *H01L 24/11* (2013.01); *H01L 24/19* (2013.01); *H01L 2223/6677* (2013.01)

(58) Field of Classification Search
CPC ... H01L 2924/15321; H01L 2924/3025; H01L 24/19; H01L 24/11
See application file for complete search history.

(56) References Cited

U.S. PATENT DOCUMENTS

| | | | |
|---|---|---|---|
| 7,361,972 | B2 | 4/2008 | Chen |
| 8,143,100 | B2 | 3/2012 | Karnezos |
| 9,355,985 | B2 | 5/2016 | Vincent et al. |
| 2003/0214049 | A1 | 11/2003 | Hortaleza et al. |
| 2005/0112796 | A1 | 5/2005 | Ararao et al. |
| 2006/0249852 | A1 | 11/2006 | Chiu et al. |
| 2008/0291115 | A1 | 11/2008 | Doan et al. |
| 2011/0079902 | A1 | 4/2011 | Sakamoto et al. |
| 2012/0126396 | A1 | 5/2012 | Zhao et al. |
| 2012/0241941 | A1 | 9/2012 | Kim et al. |
| 2013/0037936 | A1* | 2/2013 | Choi ................ H01L 23/49833 257/737 |
| 2014/0054802 | A1* | 2/2014 | Shim .................. H01L 24/11 438/126 |
| 2017/0278816 | A1* | 9/2017 | Li ........................ H01L 24/11 |
| 2019/0393172 | A1* | 12/2019 | Pietambaram .......... H01L 24/19 |
| 2021/0280507 | A1 | 9/2021 | Aldrete et al. |
| 2022/0181230 | A1 | 6/2022 | Vincent et al. |

OTHER PUBLICATIONS

Final office action dated Sep. 7, 2023 in U.S. Appl. No. 17/241,156.

* cited by examiner

SEMICONDUCTOR DEVICE PACKAGE HAVING THERMAL DISSIPATION FEATURE AND METHOD THEREFOR

BACKGROUND

Field

This disclosure relates generally to semiconductor device packaging, and more specifically, to a semiconductor device package having thermal dissipation feature and method of forming the same.

Related Art

Today, there is an increasing trend to include sophisticated semiconductor devices in products and systems that are used every day. These sophisticated semiconductor devices often have sensitive circuitry and features that can be adversely affected by environmental conditions. However, significant challenges exist to minimize or eliminate the effects of environmental conditions on such sensitive circuitry and features.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device package having a thermal dissipation feature. A conformal thermal conductive layer is applied on a semiconductor die and a bottom surface portion of a package substrate to form the thermal dissipation feature at a bottom of the package. The bottom of the package is attached and interconnected with a printed circuit board by way of conductive connectors (e.g., ball connectors). The thermal dissipation feature forms a thermal conduction path between the semiconductor die and the printed circuit board. With the thermal dissipation feature applied at the bottom of the package, a top surface of the package remains unobstructed. Accordingly, an antenna structure integrated at the top surface of the package allows for propagation of radio signals, for example, while providing enhanced heat dissipation at the bottom surface of the package. Other features such as a package-on-package (PoP) interface structure, a shielding structure, and the like may be integrated at the top surface of the package.

Figure 1:
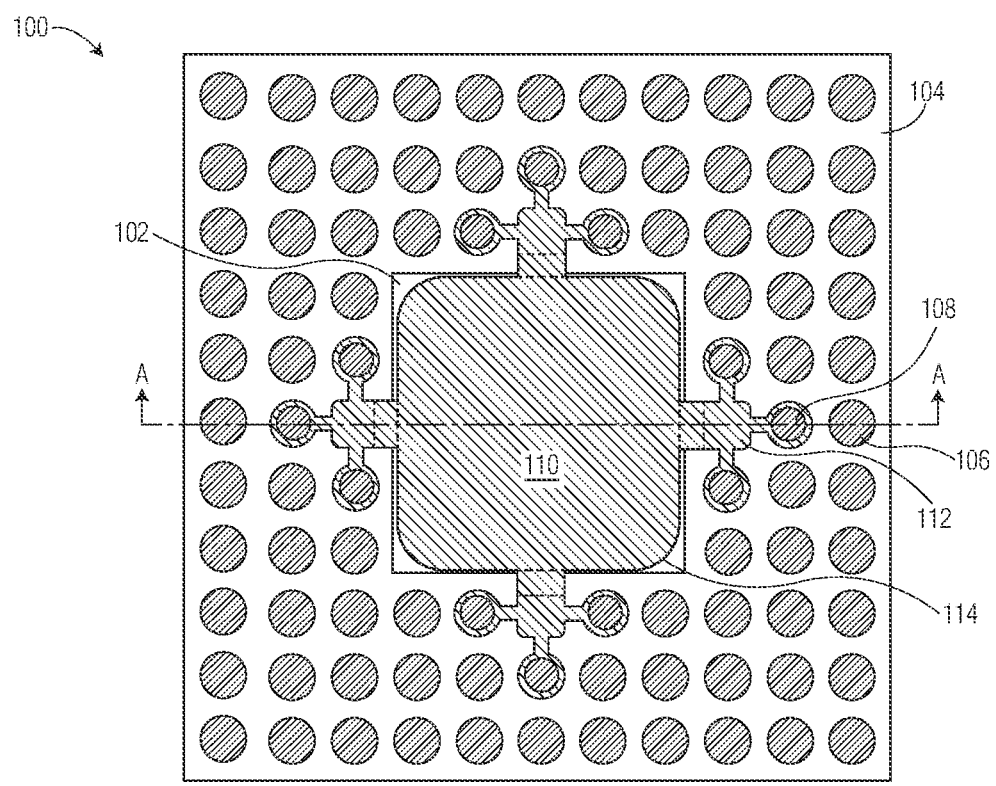
FIG. 1 illustrates, in a simplified bottom-side-up plan view, an example semiconductor device package having a thermal dissipation feature in accordance with an embodiment.

FIG. 1 illustrates, in a simplified bottom-side-up plan view, an example semiconductor device package 100 having a thermal dissipation feature in accordance with an embodiment. The package 100 includes a semiconductor die 102 mounted on a package substrate 104 having conductive connectors 106 and 108. The thermal dissipation feature is formed as an external conformal thermal conductive layer 110 applied on the semiconductor die and a portion of the bottom side surface of the package substrate 104. In this embodiment, the thermal conductive layer 110 extends laterally beyond the perimeter of the semiconductor die 102 in all directions and contacts conductive connectors 108. Cross-sectional views of examples of the semiconductor device package 100 having a thermal dissipation feature taken along line A-A at stages of manufacture are depicted in FIG. 4 through FIG. 8.

The semiconductor die 102 has an active surface (e.g., major surface having circuitry, bond pads) and a backside surface (e.g., major surface opposite of the active surface). As depicted in the bottom-side-up plan view of FIG. 1, the active surface of the semiconductor die 102 is mounted on the package substrate 104 and interconnected utilizing bond pads (not shown) at the active surface, for example. In this embodiment, the semiconductor die 102 is configured in a flip-chip orientation having the active surface mounted on the package substrate 104. The semiconductor die 102 may be formed from any suitable semiconductor material, such as silicon, germanium, gallium arsenide, gallium nitride and the like. Semiconductor die 102 may further include any digital circuits, analog circuits, RF circuits, memory, processor, the like, and combinations thereof at the active surface.

The package substrate 104 has a top surface and a bottom surface (e.g., major surface opposite of the top surface). As depicted in the bottom-side-up plan view of FIG. 1, the active surface of the semiconductor die 102 and conductive connectors 106 and 108 are mounted at the bottom surface of the package substrate 104, for example. The conductive connectors 106 may be characterized as input/output and power supply connectors whereas the conductive connectors 108 may be characterized as thermal conduction and heat dissipation path connectors. In some embodiments, the conductive connectors 108 may be configured for connection to a ground power supply, for example, in addition to being part of a thermal conduction and heat dissipation path. In this embodiment, the conductive connectors 106 and 108 are formed as ball connectors, for example, and arranged in a ball grid array (BGA). The package substrate 104 is formed as a multi-layer laminate structure having conductive features (e.g., metal traces, pads) separated by non-conductive material (e.g., FR-4). In this embodiment, the package substrate 104 is characterized as a chip scale package (CSP) type package substrate.

The thermal conductive layer 110 applied on the semiconductor die 102 and the portion of the package substrate 104 forms a thermal conduction and heat dissipation path between the semiconductor die 102 and conductive connectors 108. The thermal conductive layer 110 may be formed from materials such as conductive ink (e.g., containing copper, silver, etc.), solder, hexagonal-boron nitride, thermal conductive adhesive (e.g., alumina filled silicone), and the like. The thermal conductive layer 110 may be applied by way of jetting (e.g., inkjet, aerosol jet), stencil printing, photolithography with plating, needle dispensing, and the like. The thermal conductive layer 110 may be applied while packages are in an array (e.g., strip) form or in singulated form. In some embodiments, the thermal conductive layer 110 may include surface area enhancement features such as bumps, lines, ridges, and roughness configured to increase the surface area for enhanced heat dissipation.

Figure 2:
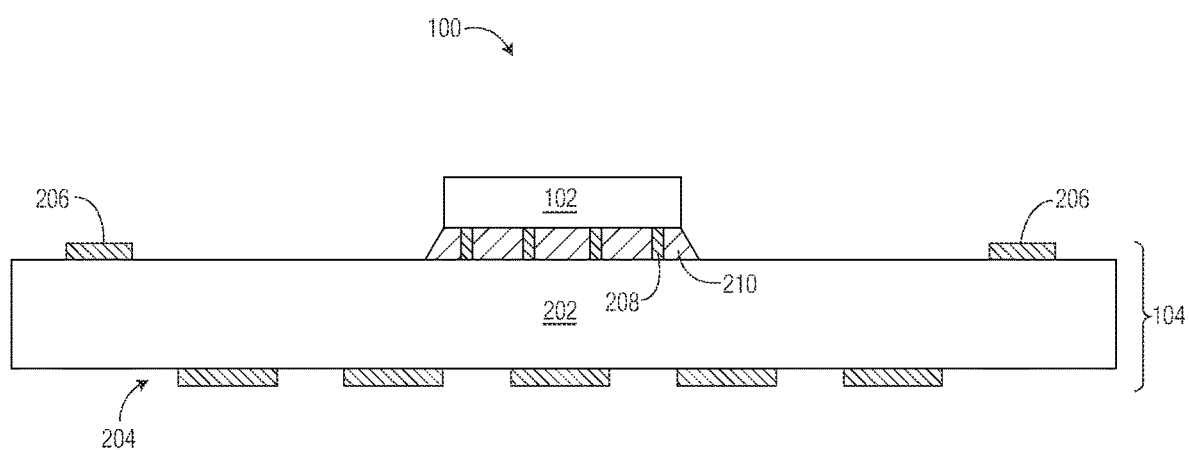
FIG. 2 illustrates, in a simplified bottom-side-up plan view, an alternative example semiconductor device package having a thermal dissipation feature in accordance with an embodiment.

FIG. 2 illustrates, in a simplified bottom-side-up plan view, an alternative example semiconductor device package 200 having a thermal dissipation feature in accordance with an embodiment. The package 200 includes a semiconductor die 202 mounted on a package substrate 204 having conductive connectors 206 and 208. The thermal dissipation feature is formed as an external conformal thermal conductive layer 210 applied on the semiconductor die and portions of the bottom side surface of the package substrate 204. In this embodiment, the thermal conductive layer 210 extends laterally beyond the perimeter of the semiconductor die 102 in fingers 212 and 214. Each of the fingers 212 and 214 contacts a group of three conductive connectors 208 by way of metal traces 216 and metal planes 218.

The semiconductor die 202 has an active surface (e.g., major surface having circuitry, bond pads) and a backside surface (e.g., major surface opposite of the active surface). As depicted in the bottom-side-up plan view of FIG. 2, the active surface of the semiconductor die 202 is mounted on the package substrate 204 and interconnected utilizing bond pads (not shown) at the active surface, for example. In this embodiment, the semiconductor die 202 is configured in a flip-chip orientation having the active surface mounted on the package substrate 204. The semiconductor die 202 may be formed from any suitable semiconductor material, such as silicon, germanium, gallium arsenide, gallium nitride and the like. Semiconductor die 202 may further include any digital circuits, analog circuits, RF circuits, memory, processor, the like, and combinations thereof at the active surface.

The package substrate 204 has a top surface and a bottom surface (e.g., major surface opposite of the top surface). As depicted in the bottom-side-up plan view of FIG. 2, the active surface of the semiconductor die 202 and conductive connectors 206 and 208 are mounted at the bottom surface of the package substrate 204, for example. The conductive connectors 206 may be characterized as input/output and power supply connectors whereas the conductive connectors 208 may be characterized as thermal conduction and heat dissipation path connectors. In some embodiments, the conductive connectors 208 may be configured for connection to a ground power supply, for example, in addition to being part of a thermal conduction and heat dissipation path. In this embodiment, the conductive connectors 206 and 208 are formed as ball connectors, for example, and arranged in a ball grid array. The package substrate 204 is formed as a multi-layer laminate structure having conductive features separated by non-conductive material. In this embodiment, the package substrate 204 is characterized as a CSP type package substrate.

The thermal conductive layer 210 applied on the semiconductor die 202 and the portion of the package substrate 204 forms thermal conduction and heat dissipation paths between the semiconductor die 202 and conductive connectors 208. The thermal conductive layer 210 may be formed from materials such as conductive ink (e.g., containing copper, silver, etc.), solder, hexagonal-boron nitride, thermal conductive adhesive (e.g., alumina filled silicone), and the like. The thermal conductive layer 210 may be applied by way of jetting (e.g., inkjet, aerosol jet), stencil printing, photolithography with plating, needle dispensing, and the like. The thermal conductive layer 210 may be applied while packages are in an array (e.g., strip) form or in singulated form. In some embodiments, the thermal conductive layer 210 may include surface area enhancement features such as bumps, lines, ridges, and roughness configured to increase the surface area for enhanced heat dissipation.

Figure 3:
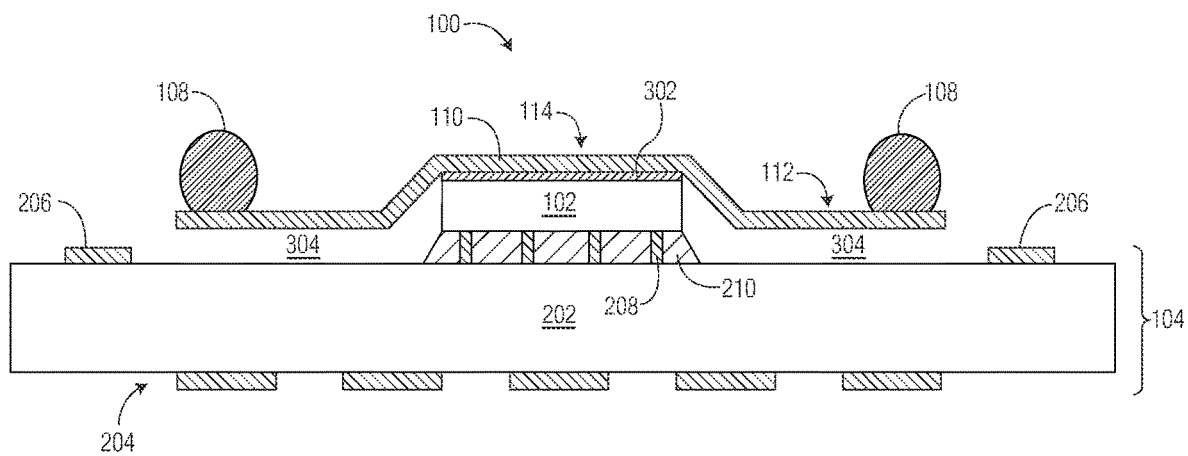
FIG. 3 illustrates, in a simplified bottom-side-up plan view, another alternative example semiconductor device package having a thermal dissipation feature in accordance with an embodiment.

FIG. 3 illustrates, in a simplified bottom-side-up plan view, another alternative example semiconductor device package 300 having a thermal dissipation feature in accordance with an embodiment. The package 300 includes a semiconductor die 302 mounted on a package substrate 304 having conductive connectors 306 and 208. The thermal dissipation feature is formed as an external conformal thermal conductive layer 310 applied on the semiconductor die and portions of the bottom side surface of the package substrate 304. In this embodiment, the thermal conductive layer 310 extends laterally beyond the perimeter of the semiconductor die 302 in fingers 312. Each of the fingers 312 contacts a group of two conductive connectors 308 by way of metal traces 314. In this embodiment, conductive connectors 308 are located near the perimeter of the package substrate allowing conductive connectors 306 near the semiconductor die 302 to be utilized for input/output connectors.

The semiconductor die 302 has an active surface (e.g., major surface having circuitry, bond pads) and a backside surface (e.g., major surface opposite of the active surface). As depicted in the bottom-side-up plan view of FIG. 3, the active surface of the semiconductor die 302 is mounted on the package substrate 304 and interconnected utilizing bond pads (not shown) at the active surface, for example. In this embodiment, the semiconductor die 302 is configured in a flip-chip orientation having the active surface mounted on the package substrate 304. The semiconductor die 302 may be formed from any suitable semiconductor material, such as silicon, germanium, gallium arsenide, gallium nitride and the like. Semiconductor die 302 may further include any digital circuits, analog circuits, RF circuits, memory, processor, the like, and combinations thereof at the active surface.

The package substrate 304 has a top surface and a bottom surface (e.g., major surface opposite of the top surface). As depicted in the bottom-side-up plan view of FIG. 3, the active surface of the semiconductor die 302 and conductive connectors 306 and 308 are mounted at the bottom surface of the package substrate 304, for example. The conductive connectors 306 may be characterized as input/output and power supply connectors whereas the conductive connectors 308 may be characterized as thermal conduction and heat dissipation path connectors. In some embodiments, the conductive connectors 308 may be configured for connection to a ground power supply, for example, in addition to being part of a thermal conduction and heat dissipation path. In this embodiment, the conductive connectors 306 and 308 are formed as ball connectors and arranged in a ball grid array. The package substrate 304 is formed as a multi-layer laminate structure having conductive features separated by non-conductive material. In this embodiment, the package substrate 304 is characterized as a CSP type package substrate.

The thermal conductive layer 310 applied on the semiconductor die 302 and the portion of the package substrate 304 forms thermal conduction and heat dissipation paths between the semiconductor die 302 and conductive connectors 308. The thermal conductive layer 310 may be formed from materials such as conductive ink (e.g., containing copper, silver, etc.), solder, hexagonal-boron nitride, thermal conductive adhesive (e.g., alumina filled silicone), and the like. The thermal conductive layer 310 may be applied by way of jetting (e.g., inkjet, aerosol jet), stencil printing, photolithography with plating, needle dispensing, and the like. The thermal conductive layer 310 may be applied while packages are in an array (e.g., strip) form or in singulated form. In some embodiments, the thermal conductive layer 310 may include surface area enhancement features such as bumps, lines, ridges, and roughness configured to increase the surface area for enhanced heat dissipation.

FIG. 4 through FIG. 8 illustrate, in simplified bottom-side-up cross-sectional views, the example semiconductor device package 100 taken along line A-A of FIG. 1 at stages of manufacture in accordance with an embodiment.

Figure 4:
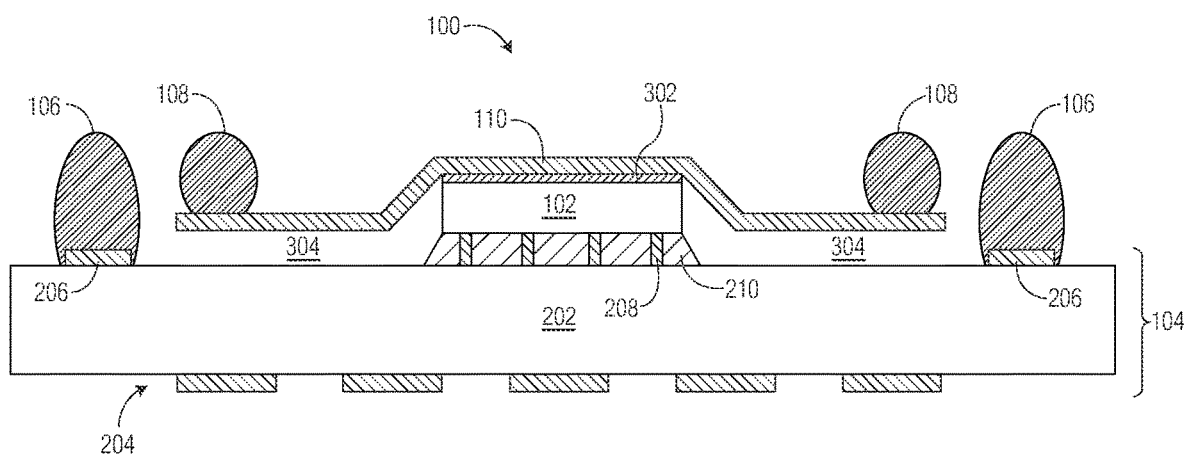
FIG. 4 through FIG. 8 illustrate, in simplified cross-sectional views, the example semiconductor device package of FIG. 1 at stages of manufacture in accordance with an embodiment.

FIG. 4 illustrates, in a simplified bottom-side-up cross-sectional view, the example semiconductor device package 100 at a stage of manufacture in accordance with an embodiment. At this stage, the package 100 includes the active surface of the semiconductor die 102 interconnected with the bottom surface of the package substrate 104 by way of conductive die connectors 410 and underfilled with an epoxy material 412. The die connectors 410 may be any suitable die connector structure such as solder bumps, gold studs, copper pillars, and the like. Features such as bond pads on the semiconductor die 102 and corresponding pads on the package substrate 104 are not shown for illustration purposes.

The package substrate 104 is formed as a multi-layer laminate structure having conductive features separated by a non-conductive material. In this embodiment, the package substrate 104 includes connector pads 406 and 408 located at the bottom surface and an antenna structure 404 integrated at the top surface of the package substrate 104. In this embodiment, the antenna structure may be configured for propagation of radio frequency (RF) signals such as a radar signals, for example. In other embodiments, features such as a package-on-package (PoP) interface structure, a shielding structure, and the like may be integrated at the top surface of the package substrate 104. The connector pads 406 and 408 and antenna structure 404 are separated by a non-conductive material 402. The connector pads 406 and 408 and antenna structure 404 may be formed from a suitable metal such as copper, for example. Interconnect features such as conductive vias and traces embedded in the package substrate 104 are not shown for illustration purposes.

Figure 5:
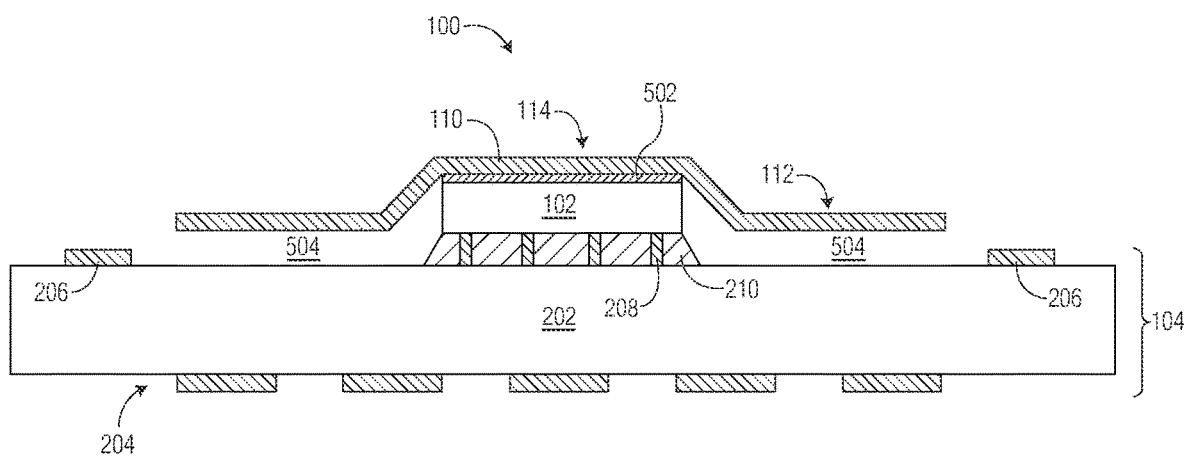

FIG. 5 illustrates, in a simplified bottom-side-up cross-sectional view, the example semiconductor device package 100 at a subsequent stage of manufacture in accordance with an embodiment. At this stage, the package 100 includes ball connectors 106 and 108 affixed on the respective connector pads 406 and 408 at the bottom surface of the package substrate 104. The ball connectors 106 and 108 may be any suitable ball connector structures such as solder balls, gold studs, copper pillars, and the like. In some embodiments, ball connectors 108 may be formed with enhanced thermal conductivity materials and/or structures.

Figure 6:
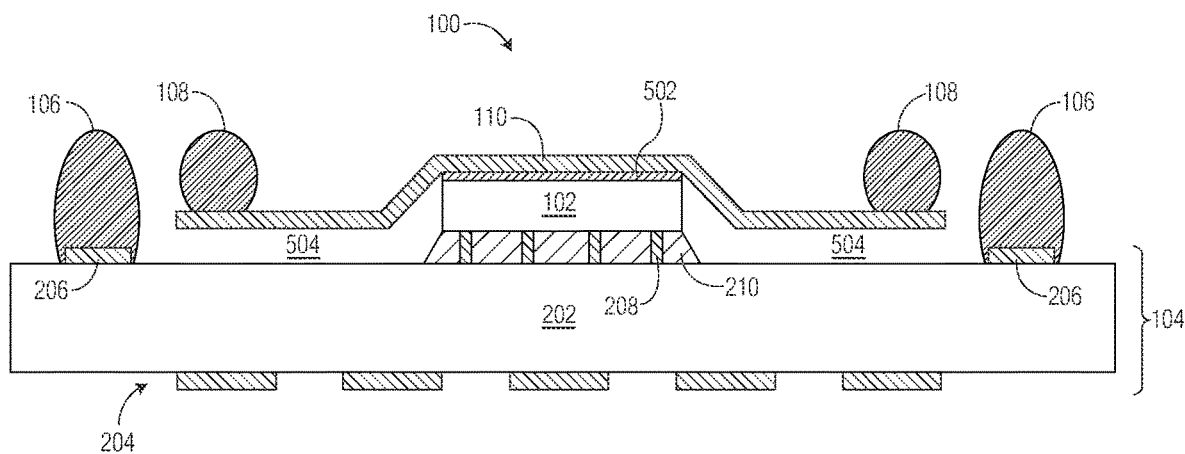

FIG. 6 illustrates, in a simplified bottom-side-up cross-sectional view, the example semiconductor device package 100 at a subsequent stage of manufacture in accordance with an embodiment. At this stage, the package 100 includes a conformal thermal conductive layer 602 applied on the backside surface of the semiconductor die 102 and a portion of the bottom side surface of the package substrate 104. After the ball connectors 106 and 108 affixed on the respective connector pads 406 and 408, the conformal thermal conductive layer 602 is applied on the backside surface of the semiconductor die 102 and the portion of the package substrate 104. In this embodiment, the conformal thermal conductive layer 602 corresponds to the conformal thermal conductive layer 110 of FIG. 1.

The conformal thermal conductive layer 602 applied on the bottom side surface of the package 100 is configured as a thermal dissipation feature. The thermal conductive layer 602 as applied forms a thermal conduction path between the semiconductor die 102 and ball connectors 108. In this embodiment, the connector pads 408 are configured with an extended portion (e.g., trace 216, plane 218 FIG. 2). Accordingly, the thermal conductive layer 602 directly contacts the extended portions of the connector pads 408 as well as portions of the ball connectors 108 to form the thermal conduction path. In some embodiments, the thermal conductive layer 602 may contact the extended portions of the connector pads 408 without directly contacting the ball connectors 108 to form the thermal conduction path.

The thermal conductive layer 602 may be formed from materials such as conductive ink (e.g., containing copper, silver, etc.), solder, hexagonal-boron nitride, thermal conductive adhesive (e.g., alumina filled silicone), and the like. The thermal conductive layer 602 may be applied by way of application apparatus 604 using methods such as jetting (e.g., inkjet, aerosol jet), stencil printing, photolithography with plating, needle dispensing, and the like. The thermal conductive layer 602 may be applied while packages are in an array (e.g., strip) form or in singulated form. In some embodiments, the thermal conductive layer 602 may include surface area enhancement features such as bumps, lines, ridges, and roughness configured to increase the surface area for enhanced heat dissipation.

Figure 7:
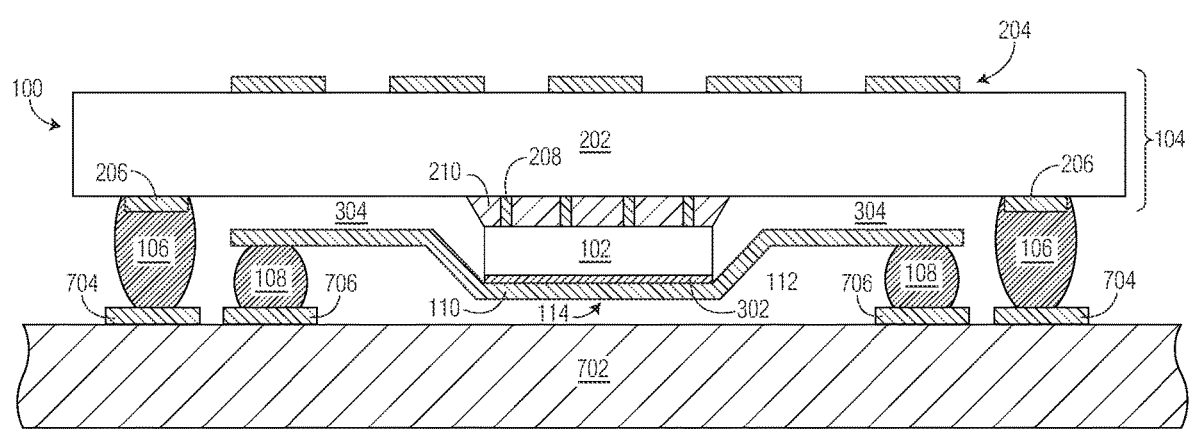
Figure 8:
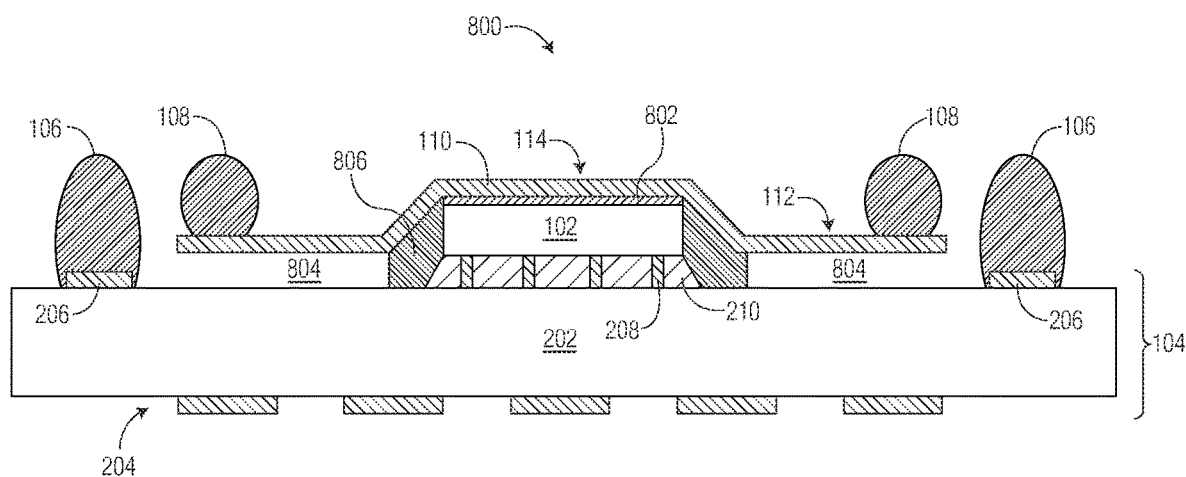

FIG. 7 and FIG. 8 illustrate, in simplified bottom-side-up cross-sectional views, the example semiconductor device package 100 taken along line A-A of FIG. 1 at alternative stages of manufacture in accordance with an embodiment. The embodiments depicted in FIG. 7 and FIG. 8 are subsequent to the stage of manufacture depicted in FIG. 4 and alternatives to the embodiments depicted in FIG. 5 and FIG. 6.

FIG. 7 illustrates, in a simplified bottom-side-up cross-sectional view, the example semiconductor device package 100 at an alternative stage of manufacture in accordance with an embodiment. At this stage, the package 100 includes a conformal thermal conductive layer 702 applied on the backside surface of the semiconductor die 102 and a portion of the bottom side surface of the package substrate 104. The conformal thermal conductive layer 702 is applied on the backside surface of the semiconductor die 102 and the portion of the package substrate 104 by way of an application apparatus 704. In this embodiment, the conformal thermal conductive layer 702 corresponds to the conformal thermal conductive layer 110 of FIG. 1.

The conformal thermal conductive layer 702 applied on the bottom side surface of the package 100 is configured as a thermal dissipation feature. The thermal conductive layer 702 as applied forms a thermal conduction path between the semiconductor die 102 and connector pads 408. In this embodiment, the connector pads 408 are configured with an extended portion (e.g., trace 216, plane 218 FIG. 2). Accordingly, the thermal conductive layer 702 directly contacts the extended portions of the connector pads 408 to form the thermal conduction path.

The thermal conductive layer 702 may be formed from materials such as conductive ink (e.g., containing copper, silver, etc.), solder, hexagonal-boron nitride, thermal conductive adhesive (e.g., alumina filled silicone), and the like. The thermal conductive layer 702 may be applied using methods such as jetting (e.g., inkjet, aerosol jet), stencil printing, photolithography with plating, needle dispensing, and the like. The thermal conductive layer 702 may be applied while packages are in an array (e.g., strip) form or in singulated form. In some embodiments, the thermal conductive layer 702 may include surface area enhancement features such as bumps, lines, ridges, and roughness configured to increase the surface area for enhanced heat dissipation.

FIG. 8 illustrates, in a simplified bottom-side-up cross-sectional view, the example semiconductor device package 100 at a subsequent stage of manufacture in accordance with an embodiment. At this stage, the package 100 includes ball connectors 106 and 108 affixed on the respective connector pads 406 and 408 in addition to the conformal thermal conductive layer 702 applied on the backside surface of the semiconductor die 102 and a portion of the bottom side surface of the package substrate 104. After the conformal thermal conductive layer 702 is applied on the backside surface of the semiconductor die 102 and portions of the package substrate 104, the ball connectors 106 and 108 are affixed on the respective connector pads 406 and 408. The ball connectors 106 and 108 may be any suitable ball connector structures such as solder balls, gold studs, copper pillars, and the like.

Figure 9:
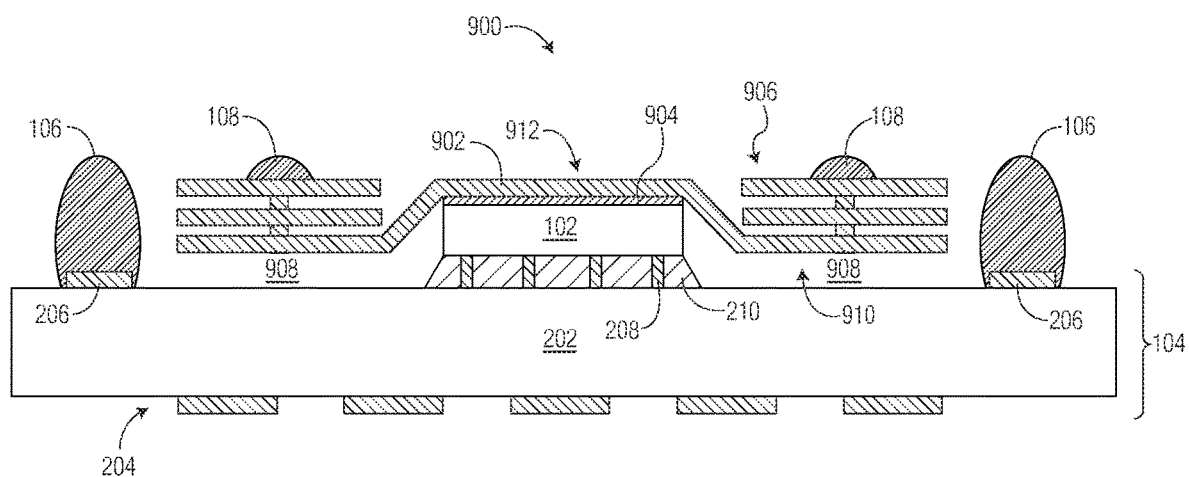
FIG. 9 illustrates, in a simplified cross-sectional view, the example semiconductor device package of FIG. 8 as mounted on a printed circuit board (PCB) in accordance with an embodiment.
Figure 10A:
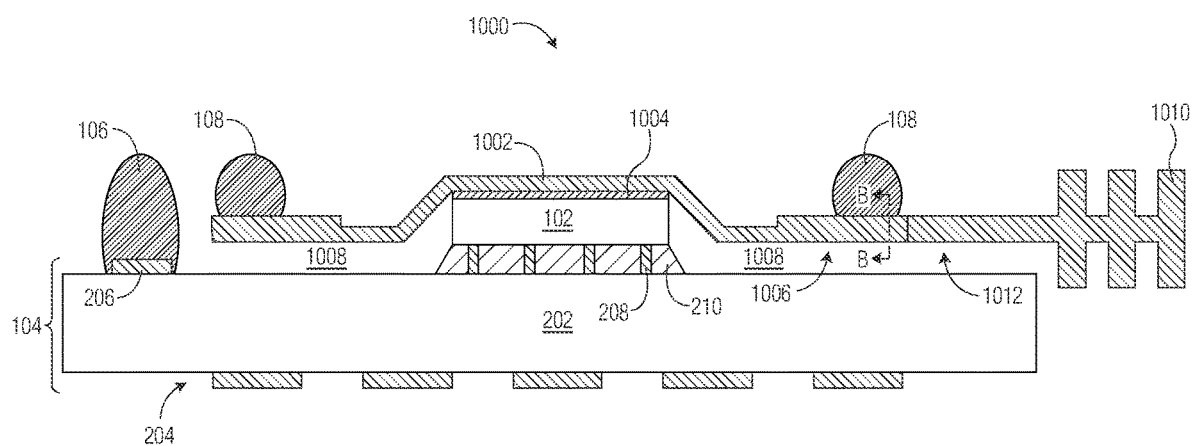
FIG. 10 illustrates, in a simplified cross-sectional view, an alternative example semiconductor device package configured with an external heatsink in accordance with an embodiment.
Figure 10B:
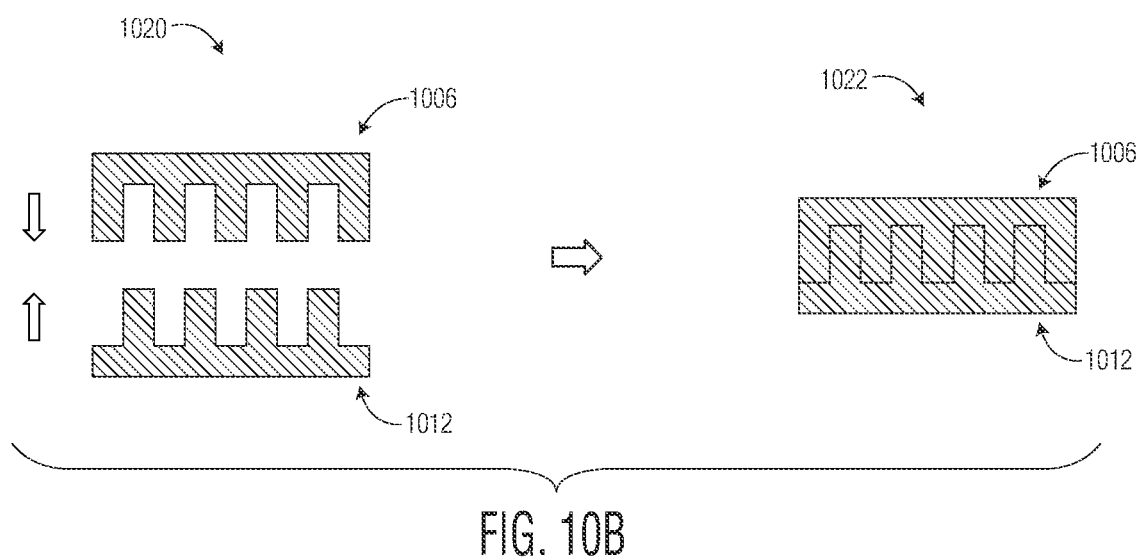

FIG. 9 illustrates, in a simplified cross-sectional view, the example semiconductor device package 100 of FIG. 6 and FIG. 8 as mounted on a printed circuit board (PCB) 902 in accordance with an embodiment. In this embodiment, the package 100 is attached and interconnected to the PCB 902 by way of the ball connectors 106 and 108. The ball connectors 106 and 108 are affixed to respective pads 904 and 906 of the PCB 902. In this embodiment, a thermal conduction path from the semiconductor die 102 is extended to the PCB by way of the ball connectors 106 and 108 and the respective pads 904 and 906. Because the thermal conduction path is formed at the bottom side of the package 100, the antenna structure 404 remains unobstructed.

Figure 10:
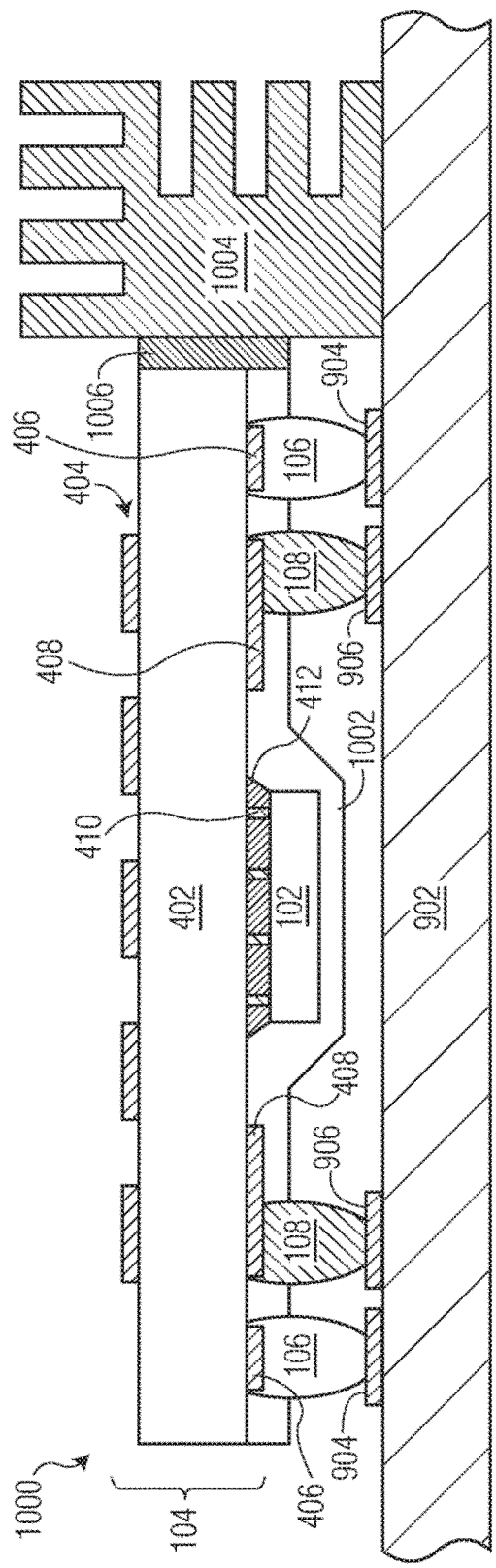
Figure 11:
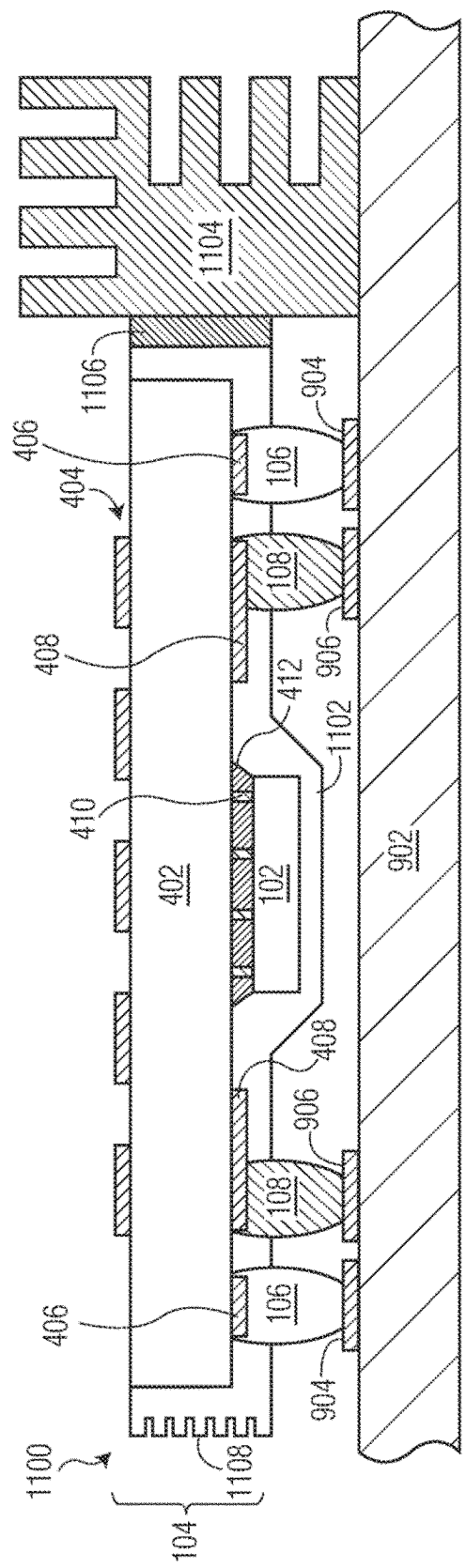

FIG. 10 illustrates, in a simplified cross-sectional view, an example semiconductor device package 1000 mounted on a printed circuit board (PCB) 902 in accordance with an embodiment. In this embodiment, the package 1000 is attached and interconnected to the PCB 902 and affixed to an external heatsink structure 1004. The package 1000 is attached and interconnected to the PCB 902 by way of the ball connectors 106 and 108. The ball connectors 106 and 108 are affixed to respective pads 904 and 906 of the PCB 902. In this embodiment, a conformal thermal conductive layer 1002 is applied on the backside surface of the semiconductor die 102 and portions of the bottom side surface of the package substrate 104 extending to edges of the package substrate 104. A thermal interface material 1006 is disposed between the package 1000 and the heatsink structure 1004 forming a continuous thermal conduction path from the semiconductor die 102 to the heatsink structure 1004. The heatsink structure 1004 may be any suitable structure configured for heat dissipation. In this embodiment, the thermal conduction path also extends to the PCB by way of the ball connectors 106 and 108 and the respective pads 904 and 906. Because the thermal conduction path is formed at the bottom side of the package 1000 and coupled to the heatsink structure 1004 at a side of the package 1000, the antenna structure 404 remains unobstructed.

Figure 11:
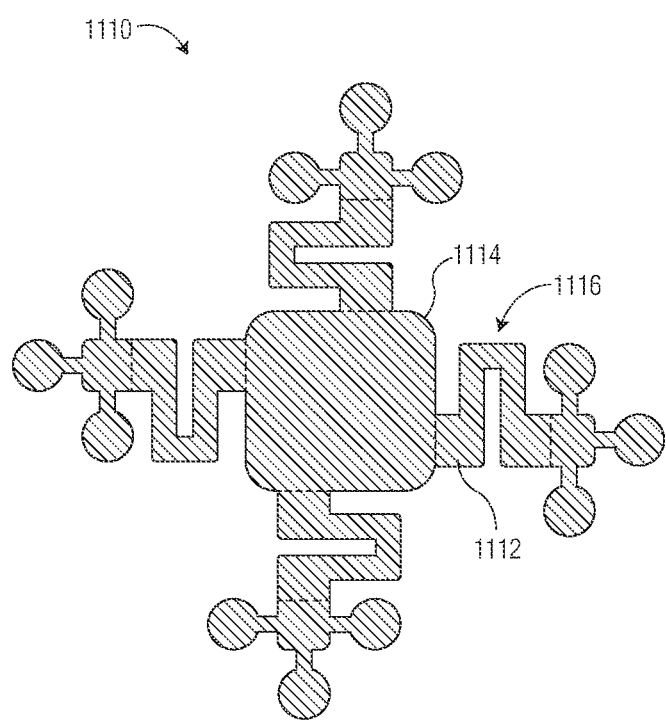
FIG. 11 illustrates, in a simplified cross-sectional view, another alternative example semiconductor device package configured with an external heatsink in accordance with an embodiment.
Figure 1:
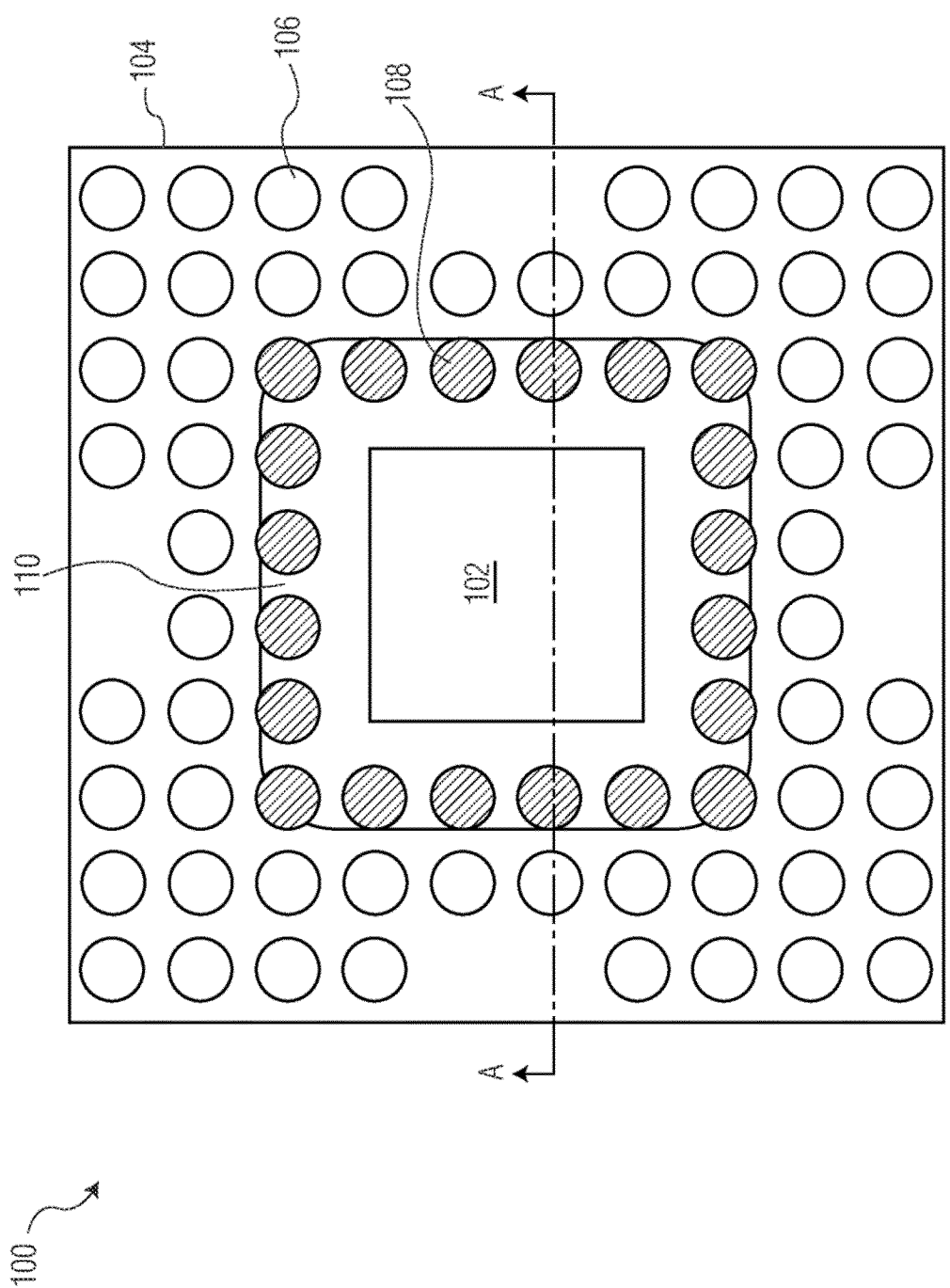
Figure 2:
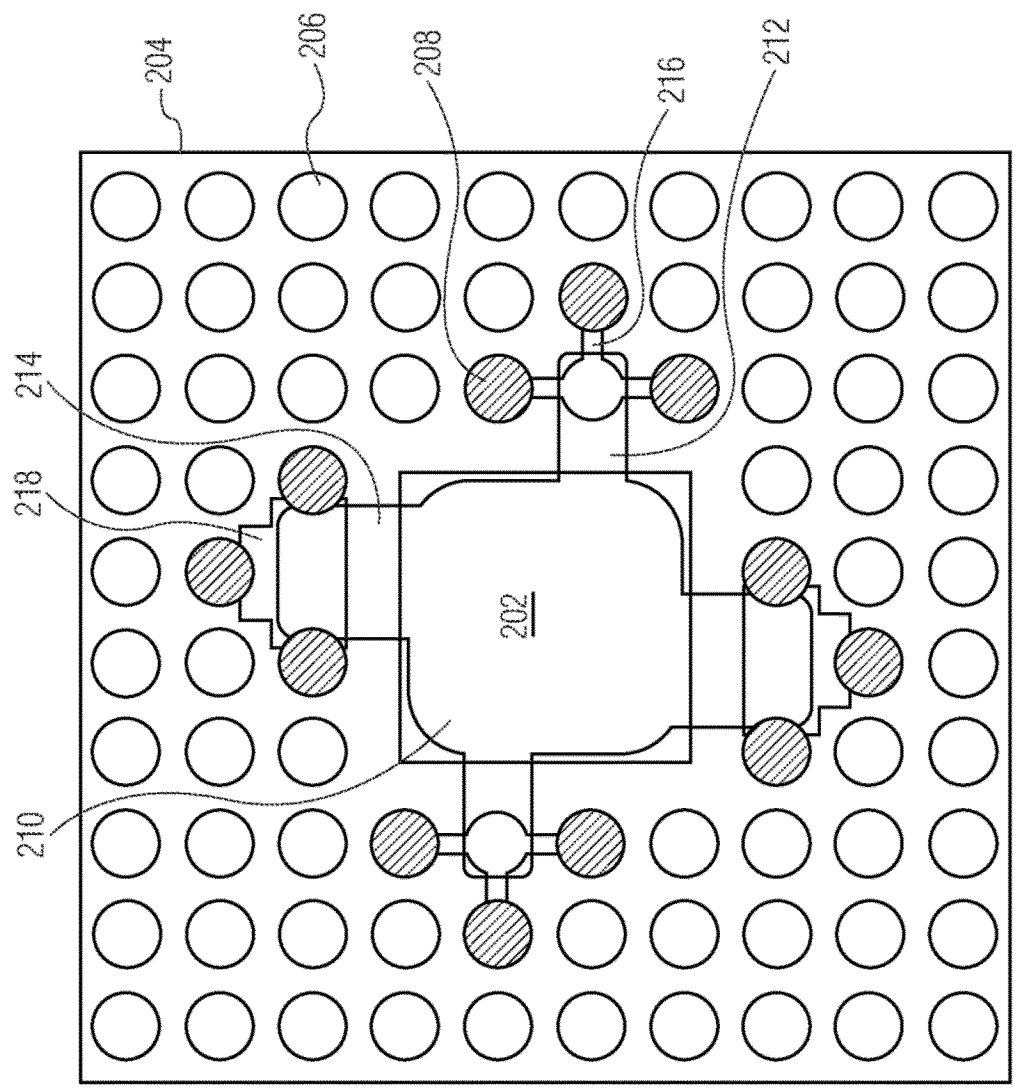
Figure 3:
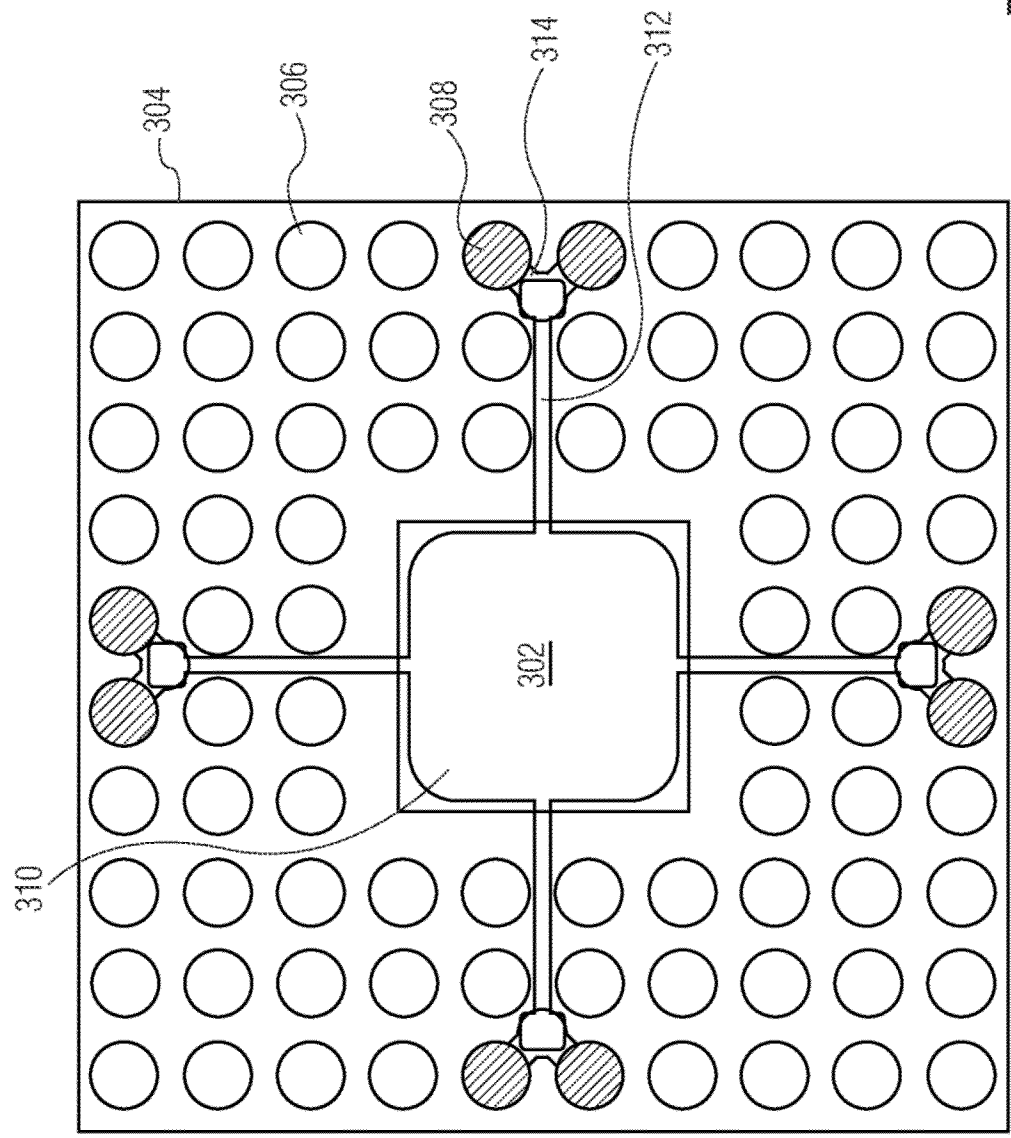
Figure 4:
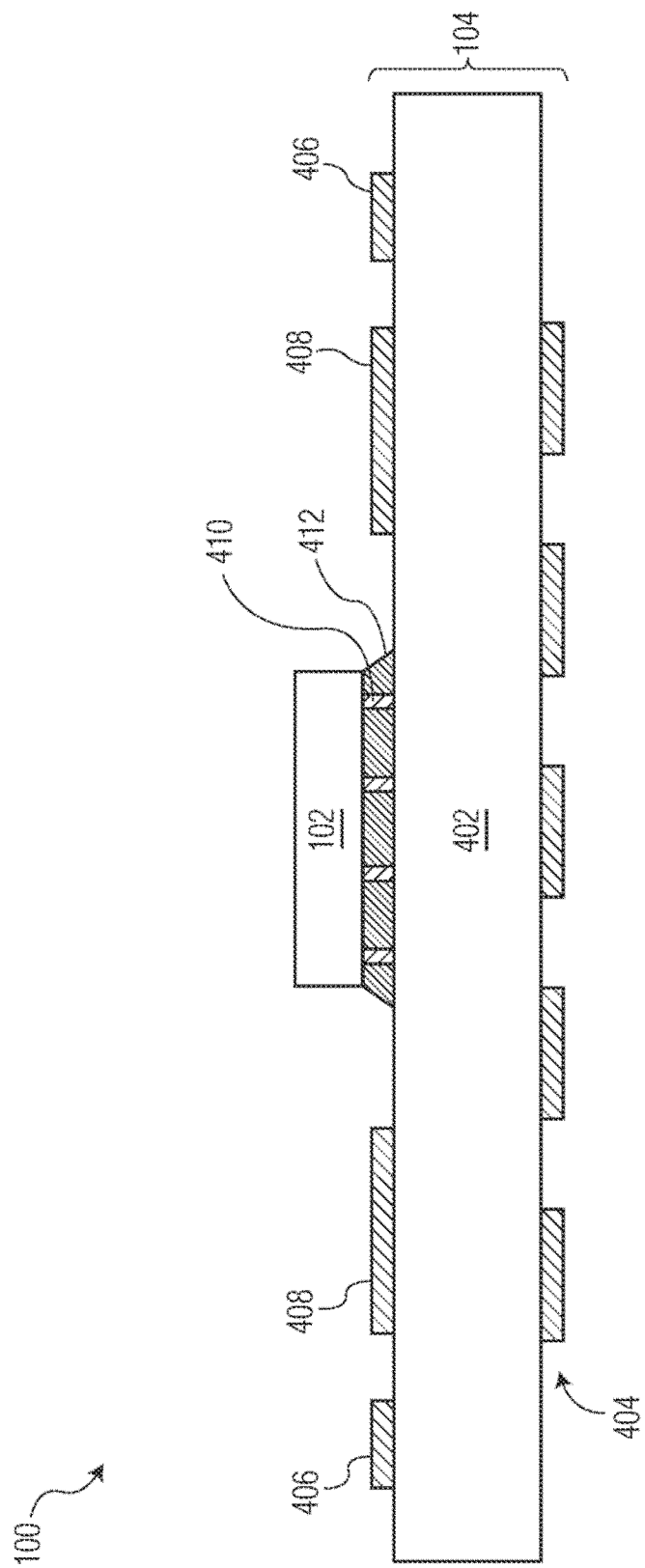
Figure 5:
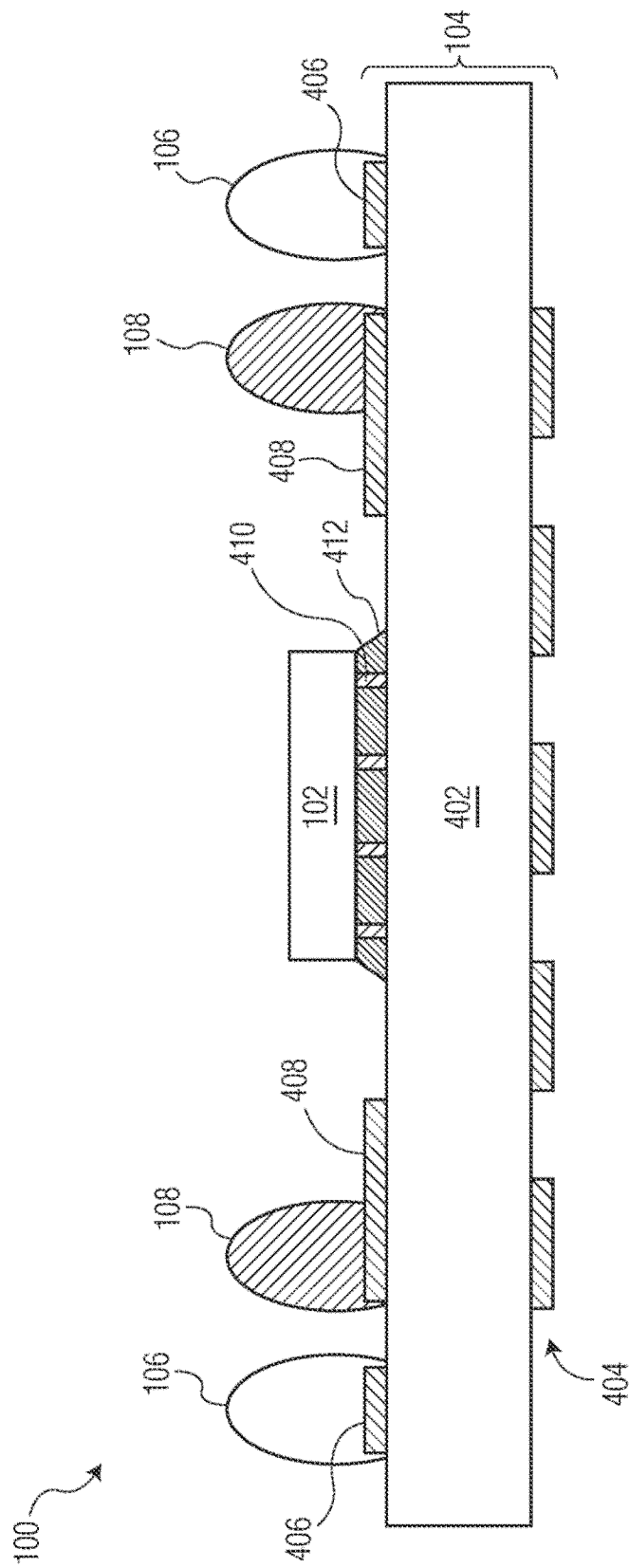
Figure 6:
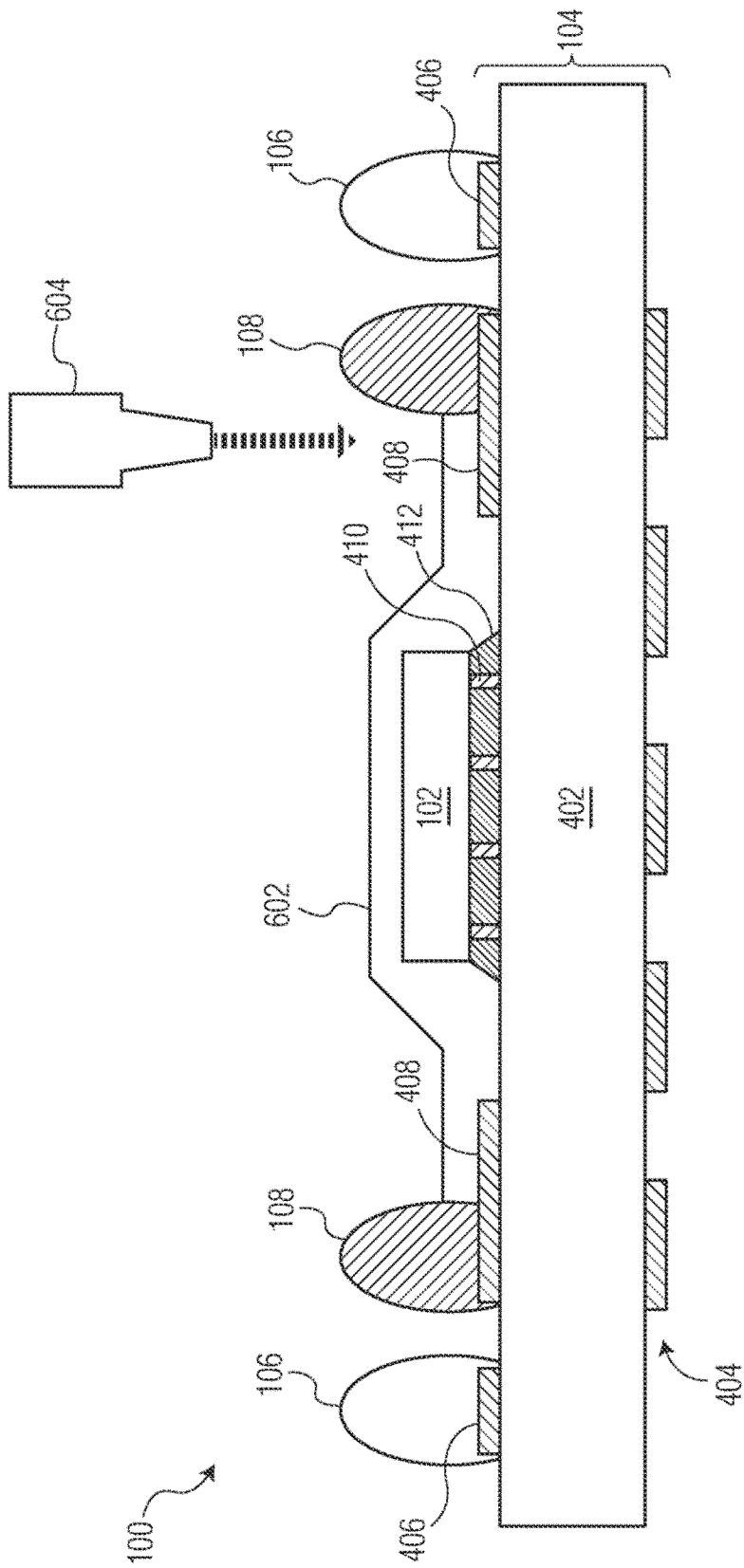
Figure 7:
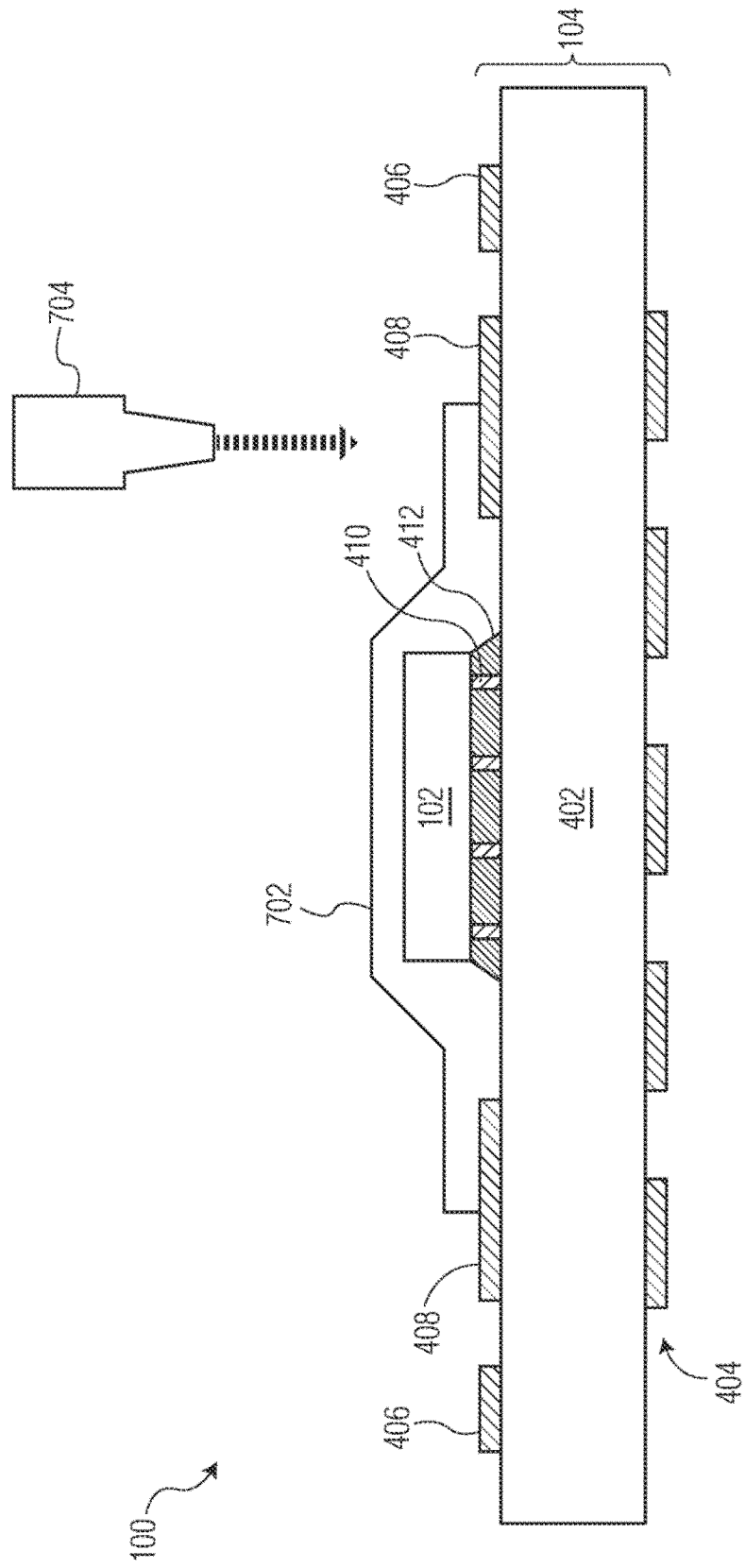
Figure 8:
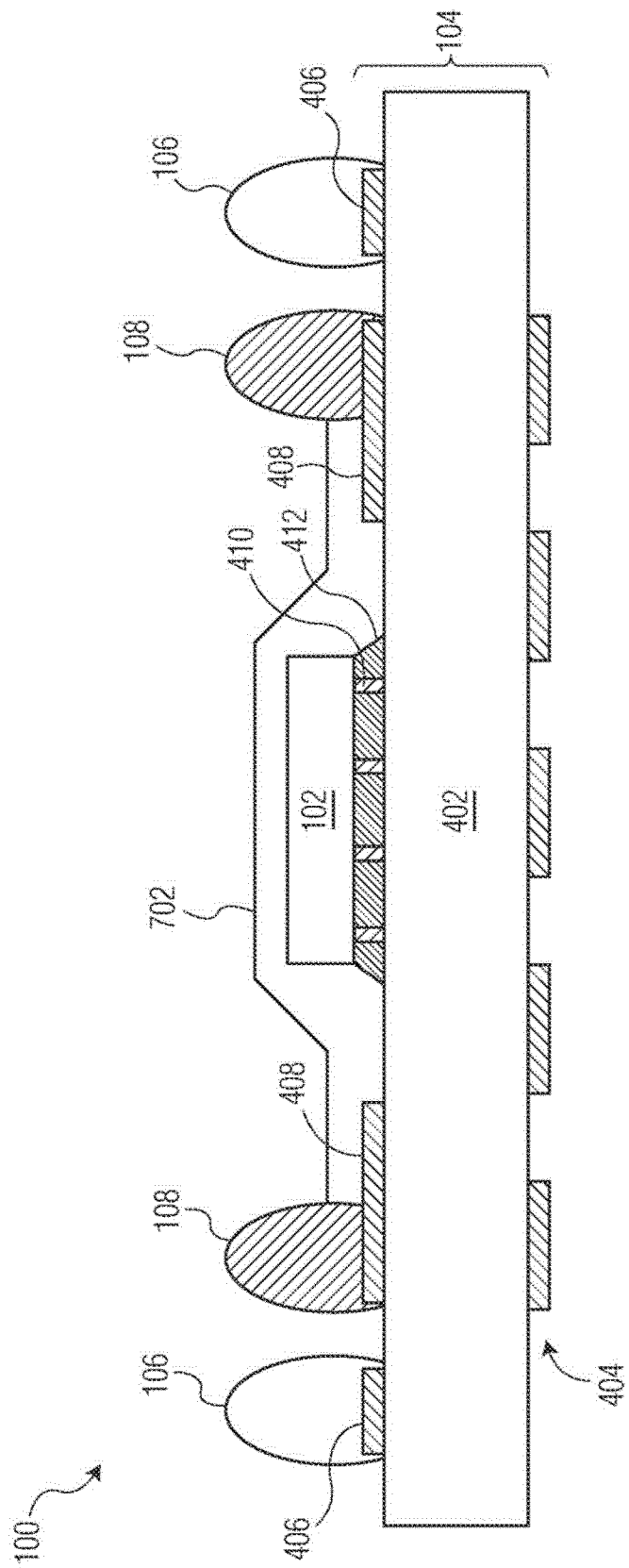
Figure 9:
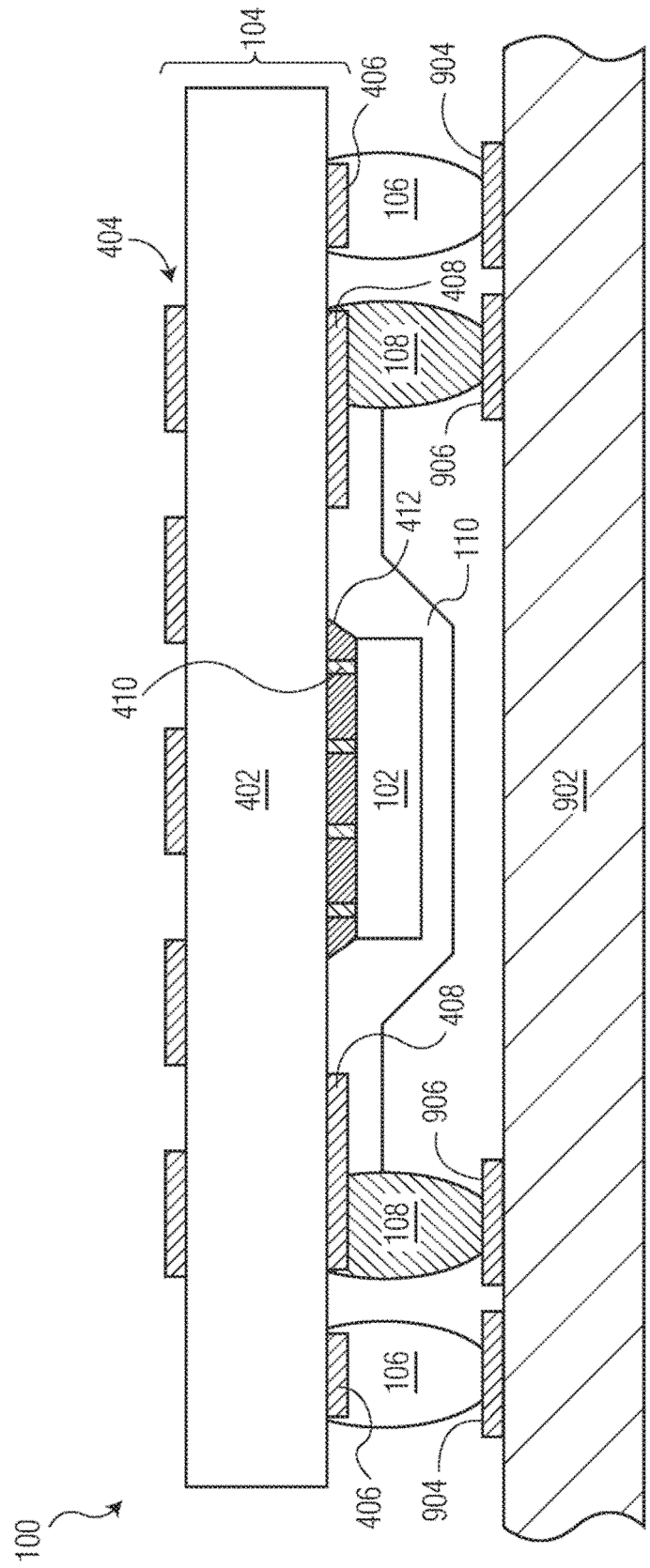

FIG. 11 illustrates, in a simplified cross-sectional view, an example semiconductor device package 1100 mounted on a printed circuit board (PCB) 902 in accordance with an embodiment. In this embodiment, the package 1100 is attached and interconnected to the PCB 902 and includes a continuous conformal thermal conductive layer 1102 extending along sidewalls of the package substrate 104. The package 1100 is attached and interconnected to the PCB 902 by way of the ball connectors 106 and 108. The ball connectors 106 and 108 are affixed to respective pads 904 and 906 of the PCB 902. In this embodiment, a conformal thermal conductive layer 1102 is applied on the backside surface of the semiconductor die 102 and portions of the bottom side surface of the package substrate 104 extending to edges and along sidewalls of the package substrate 104, forming a continuous thermal conduction path from the semiconductor die 102 to the sidewalls of the package substrate 104. A heatsink structure 1104 may be coupled to a sidewall portion of the thermal conductive layer 1102 by way of a thermal interface material 1106. The heatsink structure 1104 may be any suitable structure configured for heat dissipation. In this embodiment, the conformal thermal conductive layer 1102 may include a surface area enhancement feature 1108 such as bumps, lines, ridges, and roughness configured to increase the surface area of the conformal thermal conductive layer 1102 for enhanced heat dissipation. The thermal conduction path also extends to the PCB by way of the ball connectors 106 and 108 and the respective pads 904 and 906. Because the thermal conduction path is formed at the bottom side of the package 1100 and coupled to the heatsink structure 1104 at a side of the package 1100, the antenna structure 404 remains unobstructed.

Generally, there is provided, a semiconductor device package including a package substrate; a semiconductor die mounted on a first surface of the package substrate; a first conductive connector affixed to a first connector pad of the package substrate; and a conformal thermal conductive layer applied on the semiconductor die and a portion of the first surface of the package substrate, the conformal thermal conductive layer configured and arranged as a thermal conduction path between the semiconductor die and the first conductive connector. The semiconductor device package may further include an antenna structure integrated in the package substrate. The semiconductor device package may further include a metal trace connected to the first connector pad, the conformal thermal conductive layer directly contacting the metal trace such that the thermal conduction path extends through the metal trace. The semiconductor device package may further include a second conductive connector affixed to a second connector pad of the package substrate, the second conductive connector coupled to an input/output of the semiconductor die. The first conductive connector and the second conductive connector may be affixed at the first surface of the package substrate. The conformal thermal conductive layer may extend to an edge of the package substrate. The semiconductor device package may further include a heatsink structure contacting the conformal thermal conductive layer at the edge of the package substrate. The conformal thermal conductive layer may include a surface area enhancement feature. The package substrate may be characterized as a flip chip chip-scale package (FC-CSP) substrate.

In another embodiment, there is provided, a method including mounting a semiconductor die on a first surface of a package substrate; affixing a first conductive connector to a first connector pad at the first surface of the package substrate; and applying a conformal thermal conductive layer on the semiconductor die and a portion of the first surface of the package substrate, the conformal thermal conductive layer forming a thermal conduction path between the semiconductor die and the first conductive connector. The package substrate may include an integrated antenna structure. The package substrate may include a metal trace connected to the first connector pad, the conformal thermal conductive layer directly contacting the metal trace such that the thermal conduction path extends through the metal trace. The method may further include affixing a second conductive connector to a second connector pad of the package substrate, the second conductive connector coupled to an input/output of the semiconductor die. The applying the conformal thermal conductive layer may further include extending the conformal thermal conductive layer to an edge of the package substrate. The applying the conformal thermal conductive layer may further include applying the conformal thermal conductive layer including a surface area enhancement feature. The applying the conformal thermal conductive layer may further include applying the conformal thermal conductive layer by way of a dispensing, jetting, or plating process.

In yet another embodiment, there is provided, a semiconductor device package including a package substrate; a semiconductor die mounted on a first surface of the package substrate; a first conductive connector affixed to a first connector pad at the first surface of the package substrate; and a conformal thermal conductive layer applied on the backside of the semiconductor die and a portion of the first surface of the package substrate, the conformal thermal conductive layer configured and arranged to form a thermal conduction path between the semiconductor die and the first conductive connector. The semiconductor device package may further include an antenna structure integrated in the package substrate, the antenna structure located at a second surface of the package substrate. The semiconductor device package may further include a second conductive connector affixed to a second connector pad at the first surface of the package substrate, the second conductive connector coupled to an input/output of the semiconductor die. The first conductive connector and the second conductive connector may be characterized as balls of a ball grid array (BGA).

By now, it should be appreciated that there has been provided a semiconductor device package having a thermal dissipation feature. A conformal thermal conductive layer is applied on a semiconductor die and a bottom surface portion of a package substrate to form the thermal dissipation feature at a bottom of the package. The bottom of the package is attached and interconnected with a printed circuit board by way of conductive connectors (e.g., ball connectors). The thermal dissipation feature forms a thermal conduction path between the semiconductor die and the printed circuit board. With the thermal dissipation feature applied at the bottom of the package, a top surface of the package remains unobstructed. Accordingly, an antenna structure integrated at the top surface of the package allows for propagation of radio signals, for example, while providing enhanced heat dissipation at the bottom surface of the package. Other features such as a package-on-package (PoP) interface structure, a shielding structure, and the like may be integrated at the top surface of the package.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

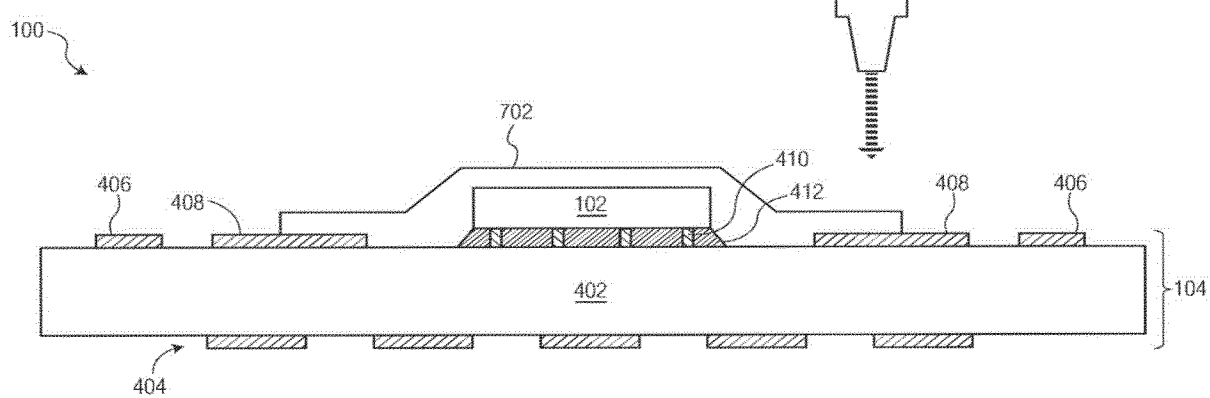

What is claimed is:

1. A semiconductor device package comprising:
a package substrate;
a semiconductor die including a first surface and second, opposing surface, wherein the first surface of the semiconductor die is mounted on a first surface of the package substrate;
a first conductive connector affixed to a first connector pad of the package substrate; and
a conformal thermal conductive layer disposed on the second surface of the semiconductor die and a portion of the first surface of the package substrate, the conformal thermal conductive layer configured and arranged as a thermal conduction path between the semiconductor die and the first conductive connector.

2. The semiconductor device package of claim 1, further comprising an antenna structure integrated in the package substrate.

3. The semiconductor device package of claim 1, further comprising a metal trace connected to the first connector pad, the conformal thermal conductive layer directly contacting the metal trace such that the thermal conduction path extends through the metal trace.

4. The semiconductor device package of claim 1, further comprising a second conductive connector affixed to a second connector pad of the package substrate, the second conductive connector coupled to an input/output of the semiconductor die.

5. The semiconductor device package of claim 4, wherein the first conductive connector and the second conductive connector are affixed at the first surface of the package substrate.

6. The semiconductor device package of claim 1, wherein the conformal thermal conductive layer extends to an edge of the package substrate.

7. The semiconductor device package of claim 6, further comprising a heatsink structure contacting the conformal thermal conductive layer at the edge of the package substrate.

8. The semiconductor device package of claim 1, wherein the conformal thermal conductive layer includes a surface area enhancement feature.

9. The semiconductor device package of claim 1, wherein the package substrate is characterized as a flip chip chip-scale package (FC-CSP) substrate.

10. A method comprising:
mounting a semiconductor die including first and second opposing surfaces on a first surface of a package substrate at a first surface of the semiconductor die;
affixing a first conductive connector to a first connector pad at the first surface of the package substrate; and
applying a conformal thermal conductive layer on the second surface of the semiconductor die and a portion of the first surface of the package substrate, the conformal thermal conductive layer forming a thermal conduction path between the semiconductor die and the first conductive connector.

11. The method of claim 10, wherein the package substrate comprises an integrated antenna structure.

12. The method of claim 10, wherein the package substrate comprises a metal trace connected to the first connector pad, the conformal thermal conductive layer directly contacting the metal trace such that the thermal conduction path extends through the metal trace.

13. The method of claim 10, further comprising affixing a second conductive connector to a second connector pad of the package substrate, the second conductive connector coupled to an input/output of the semiconductor die.

14. The method of claim 10, wherein applying the conformal thermal conductive layer further comprises extending the conformal thermal conductive layer to an edge of the package substrate.

15. The method of claim 10, wherein applying the conformal thermal conductive layer further comprises applying the conformal thermal conductive layer including a surface area enhancement feature.

16. The method of claim 10, wherein applying the conformal thermal conductive layer further comprises applying the conformal thermal conductive layer by way of a dispensing, jetting, or plating process.

17. A semiconductor device package comprising:
a package substrate;
a semiconductor die including first and second opposing surfaces and mounted, at the first surface of the semiconductor die, on a first surface of the package substrate;
a first conductive connector affixed to a first connector pad at the first surface of the package substrate; and
a conformal thermal conductive layer disposed on the second surface of the semiconductor die and a portion of the first surface of the package substrate, the conformal thermal conductive layer configured and arranged to form a thermal conduction path between the semiconductor die and the first conductive connector.

18. The semiconductor device package of claim 17, further comprising an antenna structure integrated in the package substrate, the antenna structure located at a second surface of the package substrate.

19. The semiconductor device package of claim 17, further comprising a second conductive connector affixed to a second connector pad at the first surface of the package substrate, the second conductive connector coupled to an input/output of the semiconductor die.

20. The semiconductor device package of claim 19, wherein the first conductive connector and the second conductive connector are characterized as balls of a ball grid array (BGA).

* * * * *

UNITED STATES PATENT AND TRADEMARK OFFICE
CERTIFICATE OF CORRECTION

| | | |
|---|---|---|
| PATENT NO. | : 11,817,366 B2 | Page 1 of 13 |
| APPLICATION NO. | : 17/113345 | |
| DATED | : November 14, 2023 | |
| INVENTOR(S) | : Vincent et al. | |

It is certified that error appears in the above-identified patent and that said Letters Patent is hereby corrected as shown below:

On the Title Page

Delete the title page and substitute therefore with the attached title page consisting of the corrected illustrative figure(s).

Under ABSTRACT "20 Claims, 12 Drawing Sheets" should read – 20 Claims, 11 Drawing Sheets – as shown on the attached page.

In the Drawings

Please replace drawing sheets 1-12 with drawing sheets 1-11 as shown on the attached pages.

Signed and Sealed this
Sixteenth Day of July, 2024

Katherine Kelly Vidal
*Director of the United States Patent and Trademark Office*

(12) United States Patent
Vincent et al.

(10) Patent No.: US 11,817,366 B2
(45) Date of Patent: Nov. 14, 2023

(54) SEMICONDUCTOR DEVICE PACKAGE HAVING THERMAL DISSIPATION FEATURE AND METHOD THEREFOR

(71) Applicant: NXP USA, INC., Austin, TX (US)

(72) Inventors: Michael B. Vincent, Chandler, AZ (US); Scott M. Hayes, Chandler, AZ (US); Zhiwei Gong, Chandler, AZ (US); Kabir Mirpuri, Scottsdale, AZ (US); Rushik P. Tank, Chandler, AZ (US); Betty Hill-Shan Yeung, Chandler, AZ (US)

(73) Assignee: NXP USA, INC., Austin, TX (US)

(*) Notice: Subject to any disclaimer, the term of this patent is extended or adjusted under 35 U.S.C. 154(b) by 0 days.

(21) Appl. No.: 17/113,345

(22) Filed: Dec. 7, 2020

(65) Prior Publication Data

US 2022/0181230 A1 Jun. 9, 2022

(51) Int. Cl.
*H01L 23/367* (2006.01)
*H01L 23/66* (2006.01)
(Continued)

(52) U.S. Cl.
CPC ........ *H01L 23/367* (2013.01); *H01L 21/4853* (2013.01); *H01L 21/4882* (2013.01);
(Continued)

(58) Field of Classification Search
CPC .............. H01L 23/367; H01L 21/4853; H01L 21/4882; H01L 23/49811; H01L 23/66; H01L 2223/6677; H01L 24/73; H01L 23/552; H01L 23/3672; H01L 24/16; H01L 24/32; H01L 24/92; H01L 2224/16227; H01L 2224/32225; H01L 2224/73204; H01L 23/49827; H01L 2224/32245; H01L 2224/73253; H01L 2224/92125;
(Continued)

(56) References Cited

U.S. PATENT DOCUMENTS 6,255,143 B1 7/2001 Briar
7,355,289 B2 4/2008 Hess et al.
(Continued)

FOREIGN PATENT DOCUMENTS

EP 3690935 A1 8/2020
WO 2017222471 A1 12/2017

OTHER PUBLICATIONS

U.S. Appl. No. 17/241,156, filed Apr. 27, 2021, entitled "Semiconductor Device Package Having Thermal Dissipation Feature and Method Therefor".
(Continued)

*Primary Examiner* — Patricia D Valenzuela

(57) ABSTRACT

A semiconductor device package having a thermal dissipation feature is provided. The semiconductor device package includes a package substrate. A semiconductor die is mounted on a first surface of the package substrate. A first conductive connector is affixed to a first connector pad of the package substrate. A conformal thermal conductive layer is applied on the semiconductor die and a portion of the first surface of the package substrate. The conformal thermal conductive layer is configured and arranged as a thermal conduction path between the semiconductor die and the first conductive connector.

20 Claims, 11 Drawing Sheets